US009513359B2

(12) United States Patent
Koch et al.

(10) Patent No.: US 9,513,359 B2
(45) Date of Patent: Dec. 6, 2016

(54) SYSTEMS AND METHODS FOR SHIM CURRENT CALCULATION

(75) Inventors: Kevin Matthew Koch, Milwaukee, WI (US); Eric M. Printz, New Berlin, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 1129 days.

(21) Appl. No.: 13/603,210

(22) Filed: Sep. 4, 2012

(65) Prior Publication Data
US 2014/0062475 A1    Mar. 6, 2014

(51) Int. Cl.
*G01R 33/565* (2006.01)
*G01R 33/24* (2006.01)

(52) U.S. Cl.
CPC ....... *G01R 33/56563* (2013.01); *G01R 33/243* (2013.01)

(58) Field of Classification Search
USPC .......................... 324/300–322; 600/407–435; 382/128–131
See application file for complete search history.

(56) References Cited

U.S. PATENT DOCUMENTS

| | | | |
|---|---|---|---|
| 4,931,733 A | 6/1990 | Hanawa | |
| 5,168,232 A * | 12/1992 | Glover | G01R 33/3875 324/307 |
| 6,150,815 A * | 11/2000 | Janzen | B82Y 25/00 324/307 |
| 6,211,675 B1 | 4/2001 | Ganin et al. | |
| 6,819,108 B2 | 11/2004 | Huang et al. | |
| 2008/0285835 A1 | 11/2008 | Holland et al. | |
| 2014/0062475 A1 * | 3/2014 | Koch | G01R 33/56563 324/309 |

OTHER PUBLICATIONS

Chang, Jsuan et al.; "A Technique for Accurate Magnetic Resonance Imaging in the Presence of Field Inhomogeneities"; General Electric Corporate Research and Development; Department of Computer Science; IEEE Transactions on Medical Imaging Manuscript No. 152-91; Jun. 2, 1995.
Holland, Dominic et al.; "Efficient Correction of Inhomogeneous Static Magnetic Field-Induced Distortion in Echo Planar Imaging"; National Institutes of Health; NIH Public Access Author Manuscript; Neuroimace. Mar. 2010; 50(1):175. doi: 10.1016/j.neuroimage.2009.11.044; pp. 1-18.

* cited by examiner

*Primary Examiner* — Melissa Koval
*Assistant Examiner* — Tiffany Fetzner
(74) *Attorney, Agent, or Firm* — Fletcher Yoder, P.C.

(57) ABSTRACT

A method includes receiving a forward spatial encoding polarity magnetic resonance (MR) coil image and a reverse spatial encoding polarity MR coil image generated from data obtained with a magnetic field gradient that is reversed with respect to the magnetic field gradient with which the forward spatial encoding polarity MR coil image is acquired. The method also includes performing an iterative shift map calculation algorithm to determine a pixel shift map corresponding to a minimized difference between the forward and reverse spatial encoding polarity MR coil images, converting the pixel shift map into a magnetic field shift map by determining a magnetic field value corresponding to each pixel in the pixel shift map, and providing the magnetic field shift map as an input to a shim calculation process that includes determining a level of at least one shim current.

18 Claims, 6 Drawing Sheets

SYSTEMS AND METHODS FOR SHIM CURRENT CALCULATION

BACKGROUND

The subject matter disclosed herein relates to magnetic resonance imaging (MRI), and, more particularly, to systems and methods for shim current calculation for shimming a magnet.

In general, magnetic resonance imaging (MRI) examinations are based on the interactions among a primary magnetic field, a radiofrequency (RF) magnetic field and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

The magnetic fields used to generate images in MRI systems include a magnetic field that is produced by a primary magnet. A series of gradient fields are produced by a set of gradient coils located around the subject. The gradient fields encode positions of individual plane or volume elements (pixels or voxels) in two or three dimensions. An RF coil is employed to produce an RF magnetic field. This RF magnetic field perturbs the spins of some of the gyromagnetic nuclei from their equilibrium directions, causing the spins to precess around the axis of their equilibrium magnetization. During this precession, RF fields are emitted by the spinning, precessing nuclei and are detected by either the same transmitting RF coil, or by one or more separate coils. These signals are amplified, filtered, and digitized. The digitized signals are then processed using one or more algorithms to reconstruct a useful image.

It is typically desirable for the magnetic fields produced by the primary magnet and used to generate the images in such MRI systems to be highly uniform, static magnetic fields. However, the magnetic field produced by the primary magnet within an MRI imager is typically inhomogeneous, for example, due to factors such as the presence of materials (e.g., iron) in the environment that are susceptible to magnetization in the presence of the primary magnet. Further, when the subject of interest is placed within the MRI imager for examination, additional inhomogeneities may be introduced, thus further distorting the desired uniformity of the magnetic field. Accordingly, in many instances, it may be desirable to shim the primary magnet to adjust the homogeneity of the magnetic field in an attempt to correct for the introduced inhomogeneities. However, current techniques employing such methods are often inadequate, or are subject to further improvement. For example, many current shimming techniques require substantial amounts of time to acquire required data and perform the calculations necessary to determine the amount of necessary shimming, thus reducing productivity. Accordingly, it is now recognized that a need exists for improved shimming systems and methods in magnetic resonance imaging that address one or more of the drawbacks associated with current methods.

BRIEF DESCRIPTION

In one embodiment, a method includes receiving a forward spatial encoding polarity magnetic resonance (MR) coil image and a reverse spatial encoding polarity MR coil image generated from data obtained with a magnetic field gradient that is reversed with respect to the magnetic field gradient with which the forward spatial encoding polarity MR coil image is acquired. The method also includes performing an iterative shift map calculation algorithm to determine a pixel shift map corresponding to a minimized difference between the forward and reverse spatial encoding polarity MR coil images, converting the pixel shift map into a magnetic field shift map by determining a magnetic field value corresponding to each pixel in the pixel shift map, and providing the magnetic field shift map as an input to a shim calculation process. The shim calculation process includes determining a level of at least one shim current passed through at least one shim coil to shim an MR magnet.

In another embodiment, a MR imaging system includes an imager having an MR magnet and being adapted to acquire a forward spatial encoding polarity MR coil image and a reverse spatial encoding polarity MR coil image. The reverse spatial encoding polarity MR coil image is generated from data obtained with a spatial encoding magnetic field gradient that is reversed with respect to the magnetic field gradient with which the forward spatial encoding polarity MR coil image is acquired. Further, control circuitry receives the forward spatial encoding polarity MR image and the reverse spatial encoding polarity MR image from the imager and determines a pixel shift map corresponding to a minimized difference between the forward spatial encoding polarity MR coil image and the reverse spatial encoding polarity MR coil image. The control circuitry also converts the pixel shift map into a magnetic field shift map by determining a magnetic field value corresponding to each pixel in the pixel shift map and performs a shim calculation process utilizing the magnetic field shift map as an input.

In another embodiment, one or more tangible, non-transitory machine-readable media comprising instructions executable by a processor to determine a pixel shift map corresponding to a minimized difference between a forward spatial encoding polarity MR coil image and a reverse spatial encoding polarity MR coil image. The reverse spatial encoding polarity MR coil image is generated from data obtained with a magnetic field gradient that is reversed with respect to the magnetic field gradient with which the forward spatial encoding polarity MR coil image is acquired. The media also includes instructions executable by a processor to convert the pixel shift map into a magnetic field shift map by determining a magnetic field value corresponding to each pixel in the pixel shift map and to perform a shim calculation process utilizing the magnetic field shift map as an input.

BRIEF DESCRIPTION

These and other features, aspects, and advantages of the present invention will become better understood when the following detailed description is read with reference to the accompanying drawings in which like characters represent like parts throughout the drawings, wherein.

DETAILED DESCRIPTION

As described in more detail below, provided herein are systems and methods for shimming a magnetic resonance (MR) magnet. In certain embodiments, a pixel shift map corresponding to a pixel difference between a forward spatial encoding polarity MR coil image and a reverse spatial encoding polarity MR coil image may be converted into a magnetic field shift map that may be utilized in a shim calculation process. For example, in some embodiments, the magnetic field shift map may be provided as an input to a linear or high order shim calculation algorithm that may be implemented to determine an appropriate shim current to pass through a shim coil. Further, in some embodiments, the pixel shift map may be determined by iteratively minimizing the distance between the forward and reverse spatial encoding polarity MR images until only the low order features (e.g., the first and second order features) stabilize, since the high order features may not be capable of being shimmed. In this manner, certain embodiments of the shimming techniques disclosed herein may be capable of enabling quick acquisition (e.g., in approximately a few seconds) and calculation of a field map that may be utilized in a shim calculation, thereby increasing the efficiency of the shimming process.

Figure 1:
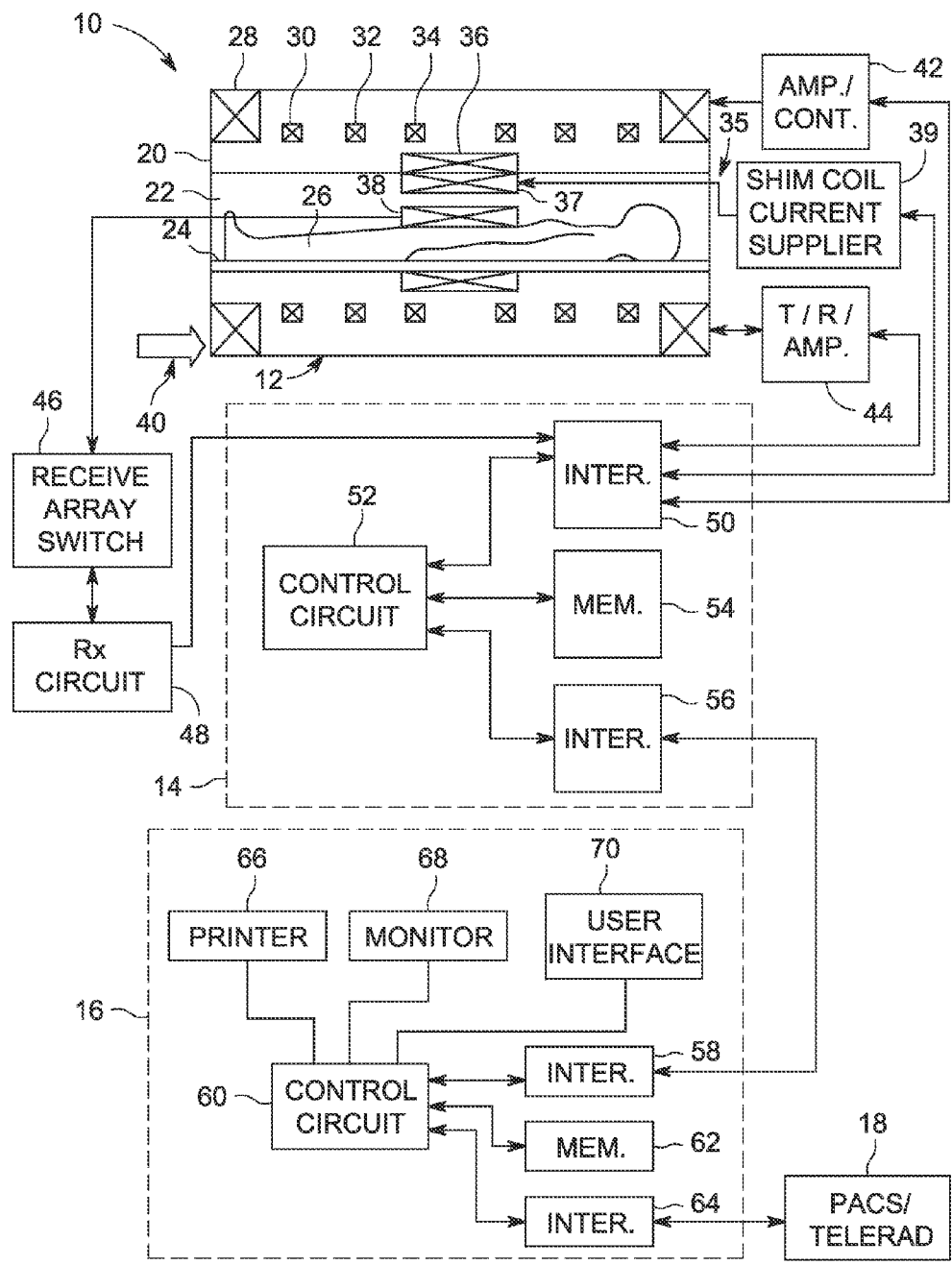
FIG. 1 is a diagrammatical illustration of an embodiment of a magnetic resonance (MR) imaging system configured to acquire MR images and perform shimming of the MR magnet in accordance with an aspect of the present disclosure.

The shim calculation implementations described herein may be performed by a magnetic resonance imaging (MRI) system, wherein specific imaging routines are initiated by a user (e.g., a radiologist). Further, the MRI system may perform data acquisition, data construction, image reconstruction/synthesis, and image processing. Accordingly, referring to FIG. 1, a magnetic resonance imaging system 10 is illustrated schematically as including a scanner 12, a scanner control circuit 14, and a system control circuitry 16. System 10 additionally includes remote access and storage systems or devices as picture archiving and communication systems (PACS) 18, or other devices, such as teleradiology equipment, so that data acquired by the system 10 may be accessed on-site or off-site.

While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient 26. The selected anatomy may be imaged by a combination of patient positioning, selected excitation of certain gyromagnetic nuclei within the patient 26, and by using certain features for receiving data from the excited nuclei as they spin and precess, as described below.

Scanner 12 includes a series of associated coils for producing controlled magnetic fields for exciting the gyromagnetic material within the anatomy of the subject being imaged. Specifically, a primary magnet coil 28 is provided for generating a primary magnetic field generally aligned with the bore 22. A series of gradient coils 30, 32, and 34 permit controlled magnetic gradient fields to be generated for positional encoding of certain of the gyromagnetic nuclei within the patient 26 during examination sequences. A radio frequency (RF) coil 36 is provided, and is configured to generate radio frequency pulses for exciting the certain gyromagnetic nuclei within the patient.

In addition to the coils that may be local to the scanner 12, the system 10 also includes a set of receiving coils 38 (e.g., a phased array of coils) configured for placement proximal (e.g., against) the patient 26. The receiving coils 38 may have any geometry, including both enclosed and single-sided geometries. As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state. The receiving coils 38 may be switched off so as not to receive or resonate with the transmit pulses generated by the scanner coils, and may be switched on so as to receive or resonate with the RF signals generated by the relaxing gyromagnetic nuclei.

Still further, in the illustrated embodiment, a shimming system 35 includes shim coils 37 that are provided in the vicinity of the subject 26 for adjusting the homogeneity of the magnetic field produced by the primary magnet 28. That is, it is typically desirable for the magnetic fields produced by the primary magnet 28 to be highly uniform, static magnetic fields, and the magnetic field produced by the primary magnet 28 within the MRI imager may be inhomogeneous in certain instances and, thus, may need to be adjusted. For example, factors such as the presence of materials (e.g., iron) in the environment that are susceptible to magnetization in the presence of the primary magnet 28 may introduce inhomogeneities into the magnetic field. In such instances, it may be desirable to shim the primary magnet 28 to adjust the homogeneity of the magnetic field in an attempt to correct for the introduced inhomogeneities. Accordingly, a shim current of a desired magnitude may be passed through the shim coils 37 to create various gradients of a desired strength, depending on implementation-specific factors. To that end, the shimming system 35 also includes a shim coil current supplier 39 that is coupled to the shim coils 37 to supply the current necessary to produce the desired magnetic field that is superimposed over the primary magnetic field to adjust the homogeneity of the magnetic field in the desired manner.

It should be noted that although the illustrated shimming system 35 includes the shim coils 37 and the shim coil current supplier 39, in other embodiments, the shimming system 35 may be configured differently. For example, the shimming system 35 may include any number of shim coils placed in any desired location in the vicinity of the subject 26. Further, the shimming system 35 may employ passive or active shimming and may include additional components not illustrated in FIG. 1. Indeed, in other embodiments, the shimming system 35 may be of any implementation-specific form capable of being utilized to shim the primary magnet.

The various coils of system 10 are controlled by external circuitry to generate the desired field and pulses, and to read emissions from the gyromagnetic material in a controlled manner. In the illustrated embodiment, a main power supply 40 provides power to the primary field coil 28. A driver circuit 42 is provided for pulsing the gradient field coils 30, 32, and 34. Such a circuit may include amplification and control circuitry for supplying current to the coils as defined by digitized pulse sequences output by the scanner control circuit 14. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry for generating the RF pulses. Similarly, the receiving coils 38 are connected to switch 46 that is capable of switching the receiving coils 38 between receiving and non-receiving modes such that the receiving coils 38 resonate with the RF signals produced by relaxing gyromagnetic nuclei from within the patient 26 while in the receiving state, and they do not resonate with RF energy from the transmitting coils (i.e., coil 36) so as to prevent undesirable operation while in the non-receiving state. Additionally, a receiving circuit 48 is provided for receiving the data detected by the receiving coils 38, and may include one or more multiplexing and/or amplification circuits.

Scanner control circuit 14 includes an interface circuit 50 for outputting signals for driving the gradient field coils 30, 32, 34, the RF coil 36, and the shim coils 37. Additionally, interface circuit 50 receives the data representative of the magnetic resonance signals produced in examination sequences from the receiving circuitry 48 and/or the receiving coils 38. The interface circuit 50 is operatively connected to a control circuit 52. The control circuit 52 executes the commands for driving the circuit 42, the circuit 44, and the shim coil current supplier 39 based on defined protocols selected via system control circuit 16. Control circuit 52 also serves to provide timing signals to the switch 46 so as to synchronize the transmission and reception of RF energy. Further, control circuit 52 receives the magnetic resonance signals and may perform subsequent processing before transmitting the data to system control circuit 16. Scanner control circuit 14 also includes one or more memory circuits 54, which store configuration parameters, pulse sequence descriptions, examination results, and so forth, during operation. The memory circuits 54, in certain embodiments, may store instructions for implementing at least a portion of the image processing techniques described herein.

Interface circuit 56 is coupled to the control circuit 52 for exchanging data between scanner control circuit 14 and system control circuit 16. Such data may include selection of specific examination sequences to be performed, configuration parameters of these sequences, and acquired data, which may be transmitted in raw or processed form from scanner control circuit 14 for subsequent processing, storage, transmission and display.

An interface circuit 58 of the system control circuit 16 receives data from the scanner control circuit 14 and transmits data and commands back to the scanner control circuit 14. The interface circuit 58 is coupled to a control circuit 60, which may include one or more processing circuits in a multi-purpose or application specific computer or workstation. Control circuit 60 is coupled to a memory circuit 62, which stores programming code for operation of the MRI system 10 and, in some configurations, the image data for later reconstruction, display and transmission. An additional interface circuit 64 may be provided for exchanging image data, configuration parameters, and so forth with external system components such as remote access and storage devices 18. Finally, the system control circuit 60 may include various peripheral devices for facilitating operator interface and for producing hard copies of the reconstructed images. In the illustrated embodiment, these peripherals include a printer 66, a monitor 68, and user interface 70 including devices such as a keyboard or a mouse.

It should be noted that subsequent to the acquisitions described herein, the system 10 may simply store the acquired data for later access locally and/or remotely, for example in a memory circuit (e.g., memory 56, 62). Thus, when accessed locally and/or remotely, the acquired data may be manipulated by one or more processors contained within an application-specific or general-purpose computer. The one or more processors may access the acquired data and execute routines stored on one or more non-transitory, machine readable media collectively storing instructions for performing methods including the field shimming methods described herein.

Figure 2:
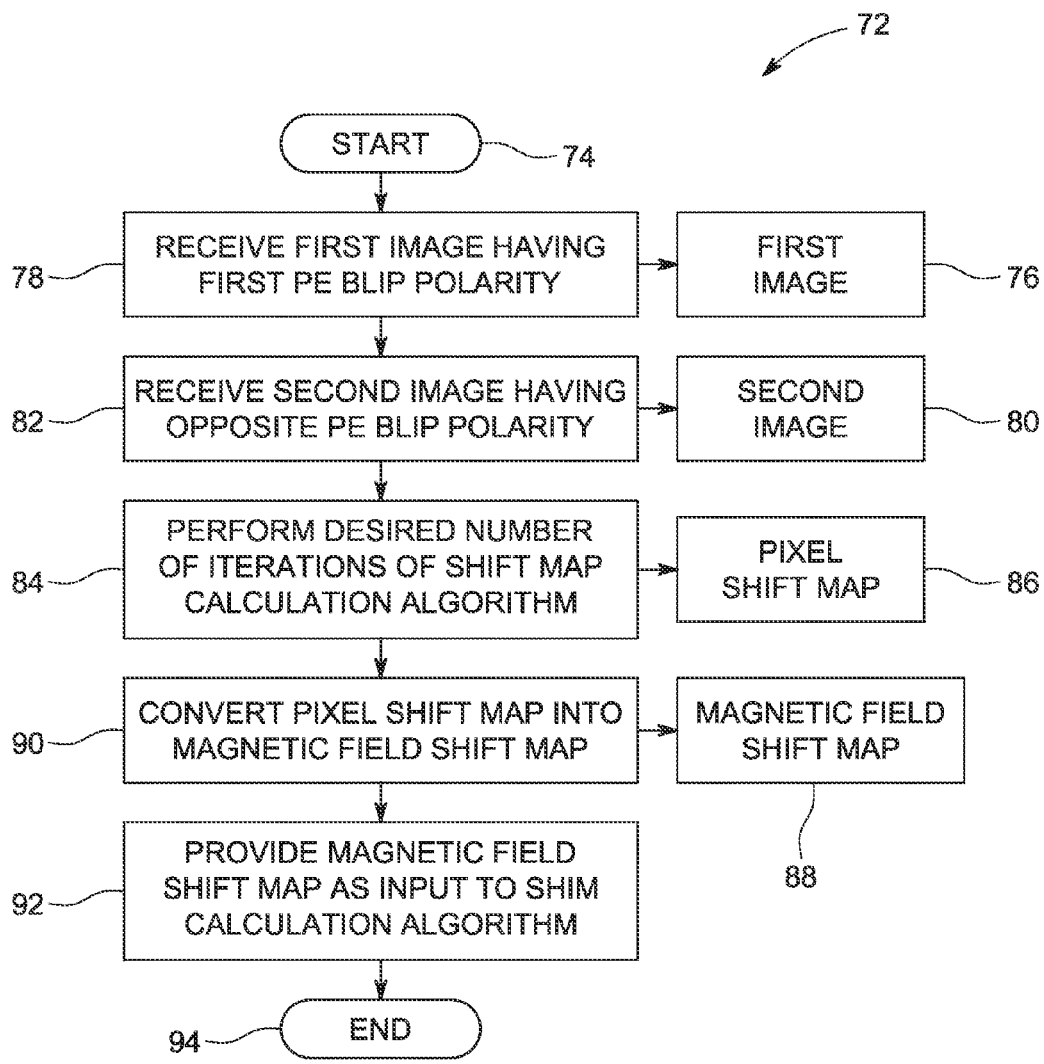
FIG. 2 is a process flow diagram illustrating an embodiment of a method for producing a magnetic field shift map that may be utilized in a shim calculation process in accordance with an aspect of the present disclosure.

One such method, as noted above, includes providing a magnetic field shift map as an input to a shim calculation process for the purpose of shimming an MR magnet. Examples of the particular acts performed during one embodiment of the disclosed methods are discussed in further detail below with respect to FIG. 2. As shown, a method 72 illustrated in FIG. 2 is initiated (block 74), and data corresponding to a first image 76 having a first pulse echo (PE) blip polarity is received (block 78). The method 72 further provides for the receiving of a second image 80 having a PE blip polarity that is opposite that of the first image (block 82).

For example, in certain embodiments, the images 76 and 80 may be acquired via an echo planar imaging (EPI) methodology. In such embodiments, the second image 80 may be acquired with a magnetic field gradient that is reversed relative to the magnetic field gradient with which the first image 76 was acquired. Accordingly, in certain instances, the first image 76 may be a forward spatial encoding polarity image, and the second image 80 may be a reverse spatial encoding polarity image (i.e., the phase-encoding gradient is reversed with respect to the gradient used to acquire the first image).

The method 72 further calls for performing a desired number of iterations of a shift map calculation algorithm (block 84) to derive a pixel shift map 86 that encodes the spatial shift necessary to "map" the first image 76 back to the second image 80 and vice versa. For example, in one embodiment, the pixel shift map 86 may be determined by identifying corresponding voxels in the first image 76 and the second image 80 by expressing the location of displacements between the images as a cost function, and iteratively minimizing the cost function, as described in detail by Holland et al., U.S. Patent Application No. 2008/0285835, which is hereby incorporated by reference. One such cost function, F, disclosed by Holland et al. that may be iteratively minimized in one embodiment until the pixel shift map 86 is obtained is:

$$F(u_1, \ldots, u_N) = \quad (1)$$

$$\frac{1}{N}\sum_{i=1}^{N}\left[J_{1i}I_1(\vec{r}+u_i\hat{y}) - J_{2i}I_2(\vec{r}+u_i\hat{y})\right]^2 + \lambda_1\sum_{i=1}^{N}u_i^2 + \lambda_2\sum_{i=1}^{N}\left[\vec{\nabla}_i u_i\right]^2,$$

where N is the quantity of voxels, i represents each voxel, $J_{1i}$ is the transformation Jacobian of the first image, $J_{2i}$ is the transformation Jacobian of the second image, $I_1$ represents the first image, $I_2$ represents the second image, $\hat{y}$ is the phase encoding axis, $\vec{r}$ represents integers associated with each voxel, u represents a displacement field for each voxel, and $\lambda_1$ and $\lambda_2$ are regularization parameters. Again, in one embodiment, equation 1 may be iteratively minimized until the desired pixel shift map 86 is obtained.

Once the pixel shift map 86 is determined, the method 72 proceeds by converting the pixel shift map 86 into a magnetic field shift map 88 (block 90). In certain embodiments, a physical magnetic field corresponding to each pixel in the pixel shift map 86 may be determined in accordance with implementation-specific factors in order to convert the pixel shift map 86 into the magnetic field shift map 88. For example, in some embodiments, the foregoing conversion may be based on one or more features of the image acquisition process used to acquire the first image 76 and the second image 80. For further example, in one embodiment in which the images 76 and 80 are acquired via EPI, the EPI encoding may be utilized to determine the magnetic field corresponding to each pixel in the pixel shift map 86.

Once the magnetic field shift map 88 is determined, the method 72 proceeds by providing the magnetic field shift map as an input to a shim calculation algorithm (block 92), and the method 72 is concluded (block 94). That is, once determined, the magnetic field shift map 88 may be utilized as an input for a shim calculation process. For example, in some embodiments, the magnetic field shift map 88 may be provided as an input to a linear or high order shim calculation algorithm that may be implemented to determine an appropriate shim current to pass through a shim coil, such as shim coil 37 in the system 10 of FIG. 1. In such a way, the magnetic field shift map 88 may be utilized to adjust the shim current to partially or completely cancel any gradients that are present in the magnetic field.

Figure 3:
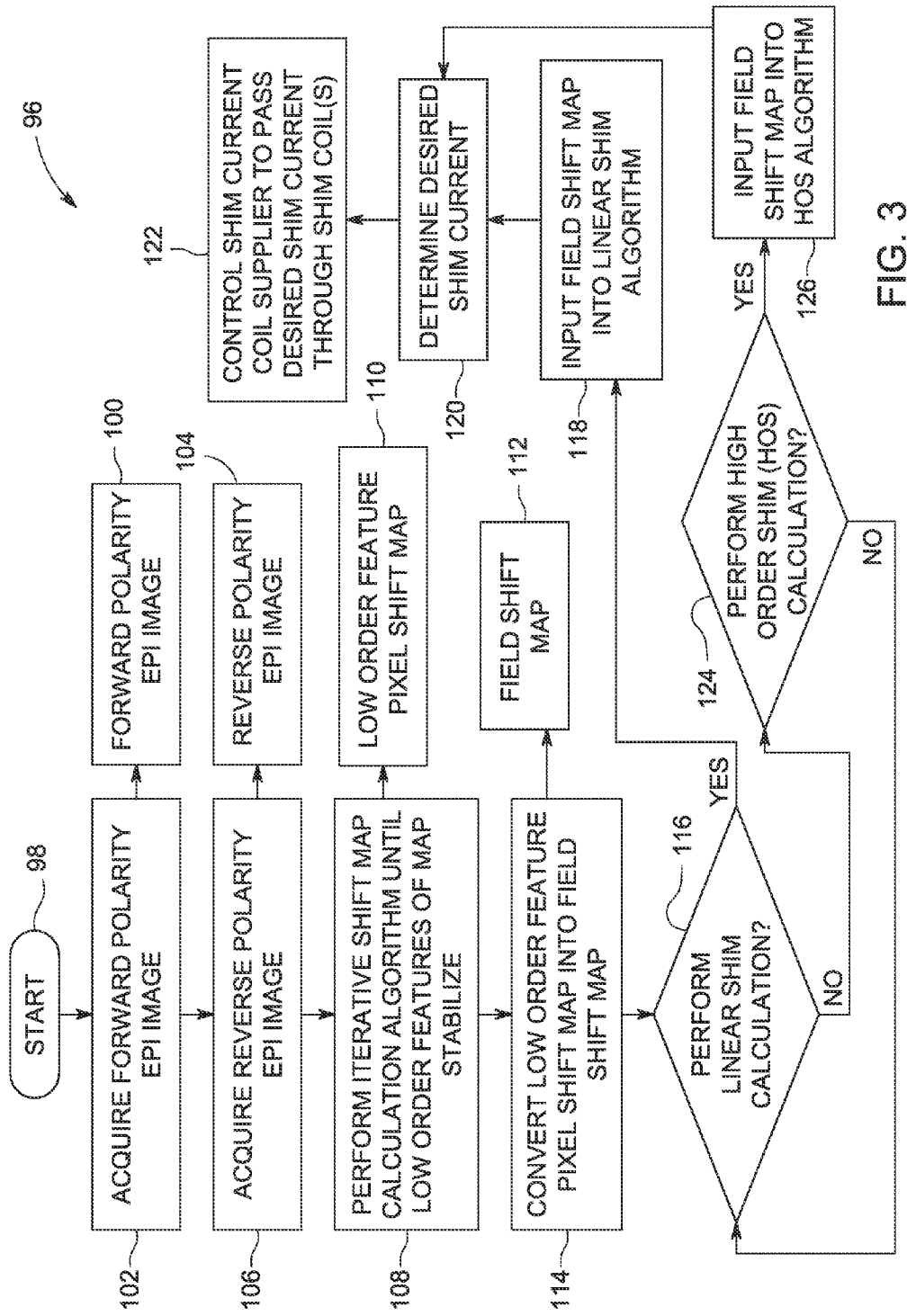
FIG. 3 is a process flow diagram illustrating an embodiment of a method for producing a magnetic field shift map via stabilization of low order map features in accordance with an aspect of the present disclosure.

FIG. 3 is a process flow diagram illustrating an embodiment of a method 96 for producing the magnetic field shift map via stabilization of low order map features in accordance with one embodiment. Once the method 96 begins (block 98), a forward spatial encoding polarity EPI image 100 is acquired (block 102), and a reverse spatial encoding polarity EPI image 104 is also acquired (block 106). Here again, the foregoing images 100 and 104 are acquired by utilizing a first phase-encoding gradient for the forward spatial encoding polarity image 100 and then reversing the phase-encoding gradient for acquisition of the reverse spatial encoding polarity image 104.

The method 96 proceeds by performing an iterative shift map calculation algorithm until the low order features of the map stabilize (block 108), and a low order feature pixel shift map 110 is determined. That is, in this embodiment, the pixel shift map 86 is a low order optimized shift map 110, thus enabling the iterative shift map calculation to be truncated compared to traditional calculations. For example, in some embodiments, the shift map calculation algorithm may be performed until the linear first and second order spatial features of the map stabilize (e.g., approximately 3-5 iterations when equation 1 is iteratively minimized). The foregoing truncation may be utilized in certain embodiments of the presently disclosed shimming methods because the higher order features may correspond to features that cannot be shimmed and, thus, are not relevant for the shim calculation. In other embodiments, however, the higher order features may be incorporated into the pixel shift map 86, for example, for fine tuning purposes.

In the illustrated embodiment, the method 96 proceeds by converting the low order feature pixel shift map 110 into a low order magnetic field shift map 112 (block 114). As discussed in more detail above, the foregoing map conversion is performed in accordance with implementation-specific features of the image acquisition process that was employed to obtain the images 100 and 104. Once obtained, the low order optimized magnetic field shift map 112 is utilized as an input to a shim calculation process. In the illustrated method 96, a check is performed as to whether a linear shim calculation is desired (block 116). For example, a user of the imaging system 10 may communicate the desired shimming method to control circuit 52 via a suitable user interface, and the circuitry 52 may reference the memory 54 to determine which shim calculation process was selected by the user. If a linear shim calculation is desired, the low order optimized magnetic field shift map 112 is provided as an input to the linear shim algorithm (block 118), and an appropriate shim current is determined (block 120). The shim coil current supplier 39 is then controlled to pass the appropriate amount of shim current through the shim coils 37 (block 122) to create a substantially homogenous magnetic field about the patient 26.

However, if a linear shim calculation is not desired, the method 96 proceeds to check if a high order shim (HOS) calculation is desired (block 124). If a HOS calculation is desired, the magnetic field shift map 112 is input into the HOS calculation algorithm (block 126), and an appropriate shim current is determined (block 120). Here again, the shim coil current supplier 39 is then controlled to pass the appropriate amount of shim current through the shim coils 37 (block 122).

Figure 4:
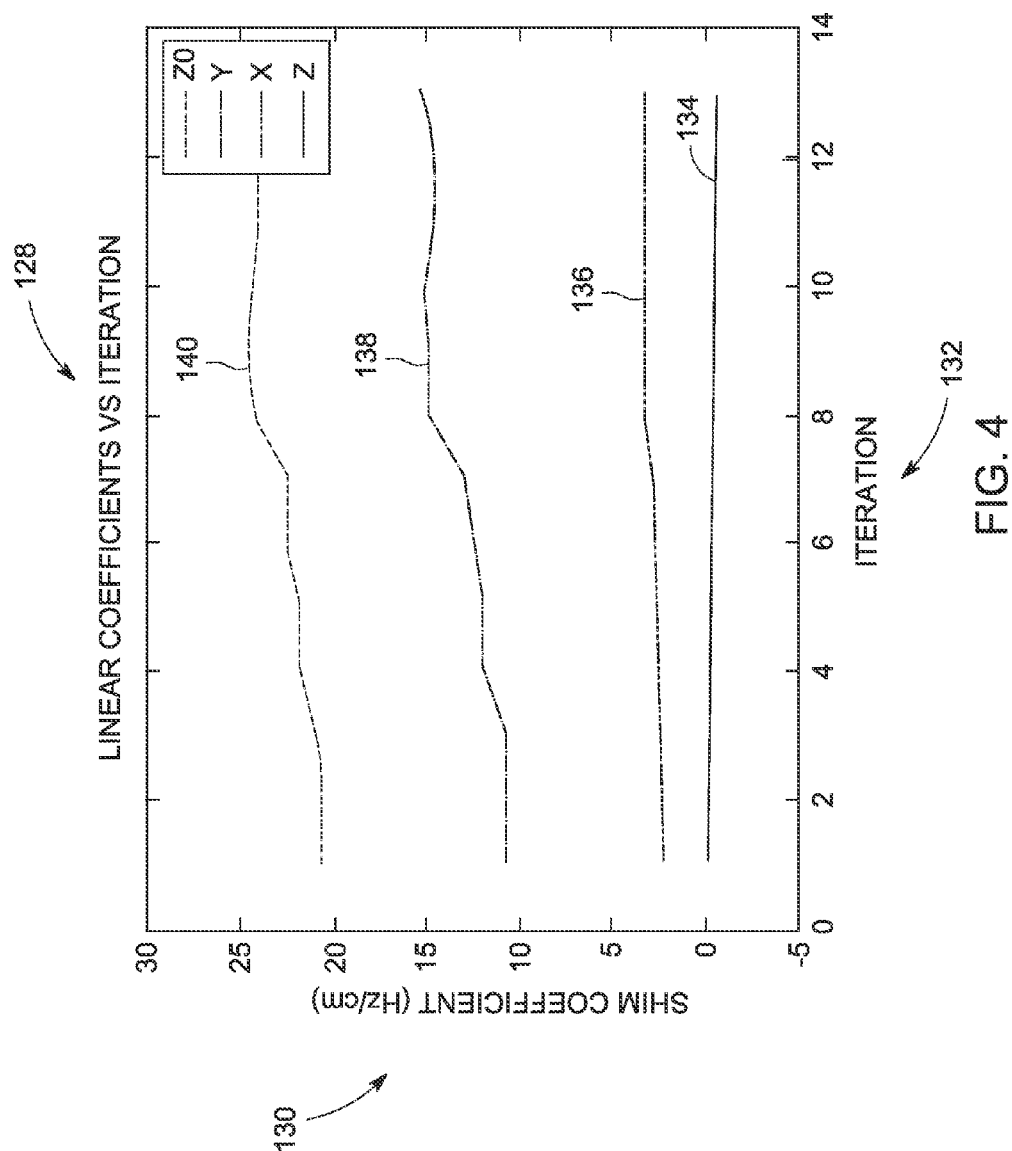
FIG. 4 illustrates an example of a first order shim coefficient versus iteration plot for a shim calculation in accordance with an aspect of the present disclosure.

FIG. 4 illustrates an example of a shim coefficient versus iteration plot 128 for an example of a shim calculation in which a variety of first order shim coefficients are obtained and subsequently translated into shim currents that may be utilized to shim the MR magnet in accordance with one embodiment. The illustrated plot 128 includes a shim coefficient axis 130 and an iteration number axis 132. The plot 128 also includes a first low order shim coefficient plot 134, a second low order shim coefficient plot 136, a third low order shim coefficient plot 138, and a fourth low order shim coefficient plot 140. As illustrated, the low order (zeroth and first-order) shim coefficient plots 134, 136, 138, and 140 stabilize quickly, after about a single iteration in the illustrated example. It should be noted that the observed variation in plots 138 and 140 may be attributable to noise that is typically associated with large volume shim optimizations.

Figure 5:
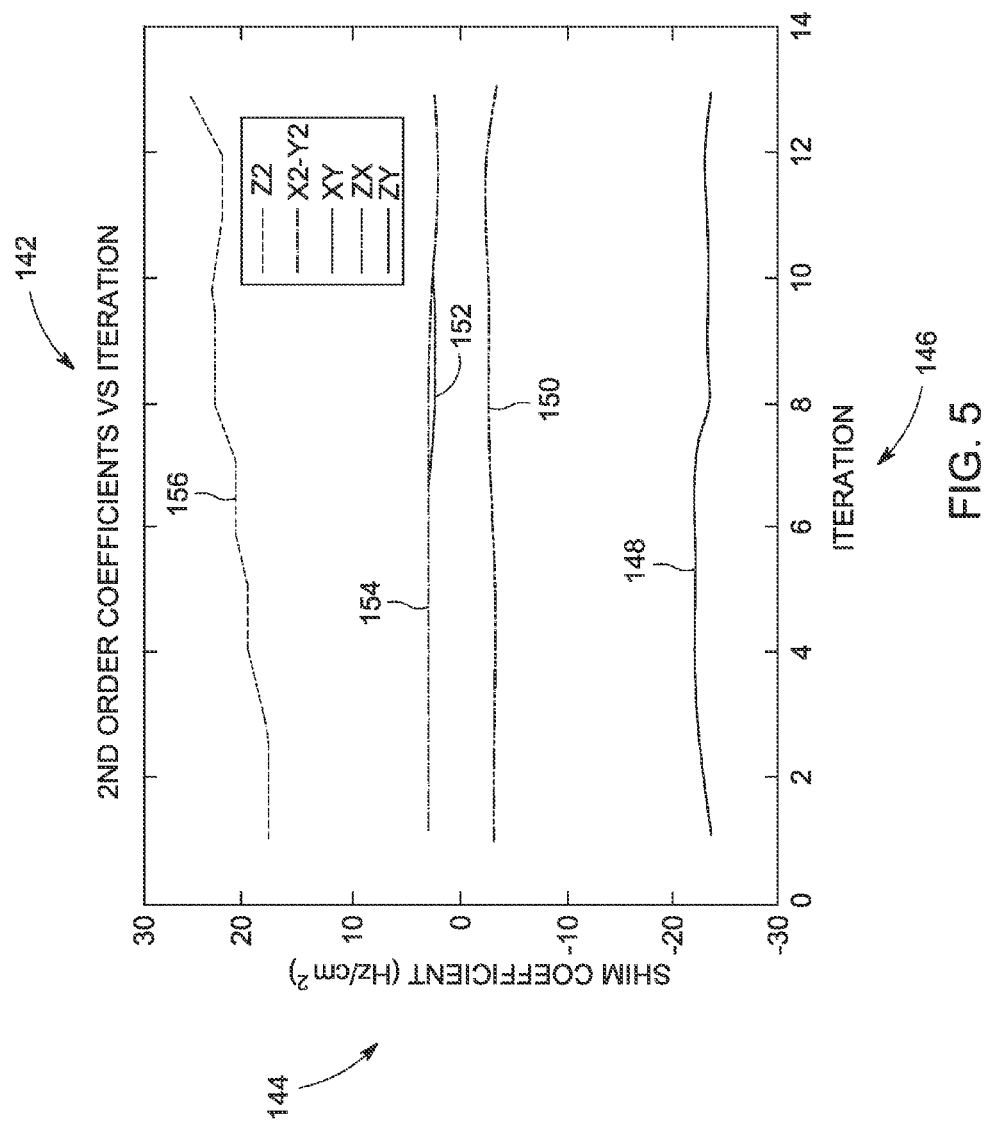
FIG. 5 illustrates an example of a second order shim coefficient versus iteration plot for a shim calculation in accordance with an aspect of the present disclosure.

FIG. 5 illustrates an example of a shim coefficient versus iteration plot 142 for an example shim calculation in which a variety of second order shim coefficients are obtained and subsequently translated into shim currents that may be utilized to shim the MR magnet in accordance with one embodiment. In this embodiment, the plot 142 includes a shim coefficient axis 144, an iteration axis 146, and shim coefficient plots 148, 150, 152, 154, and 156. Here again, as illustrated, the plots 148, 150, 152, 154, and 156 corresponding to the second order shim coefficients quickly stabilize within a few iterations.

In some embodiments, the lower order (e.g., the first and second order) spatial features may be more susceptible to correction via shimming than the higher order spatial features. Since the low order shim coefficients, which may be translated into the necessary shim currents, stabilize within a few iterations in some embodiments, the foregoing methods may enable relatively quick shimming as compared to traditional designs. That is, in some embodiments, the relatively quick stabilization of the low order shim coefficients may enable the necessary shim currents to be quickly determined based on the low order shim coefficients, thus enabling a relatively quick shimming of the MR magnet.

Figure 6:
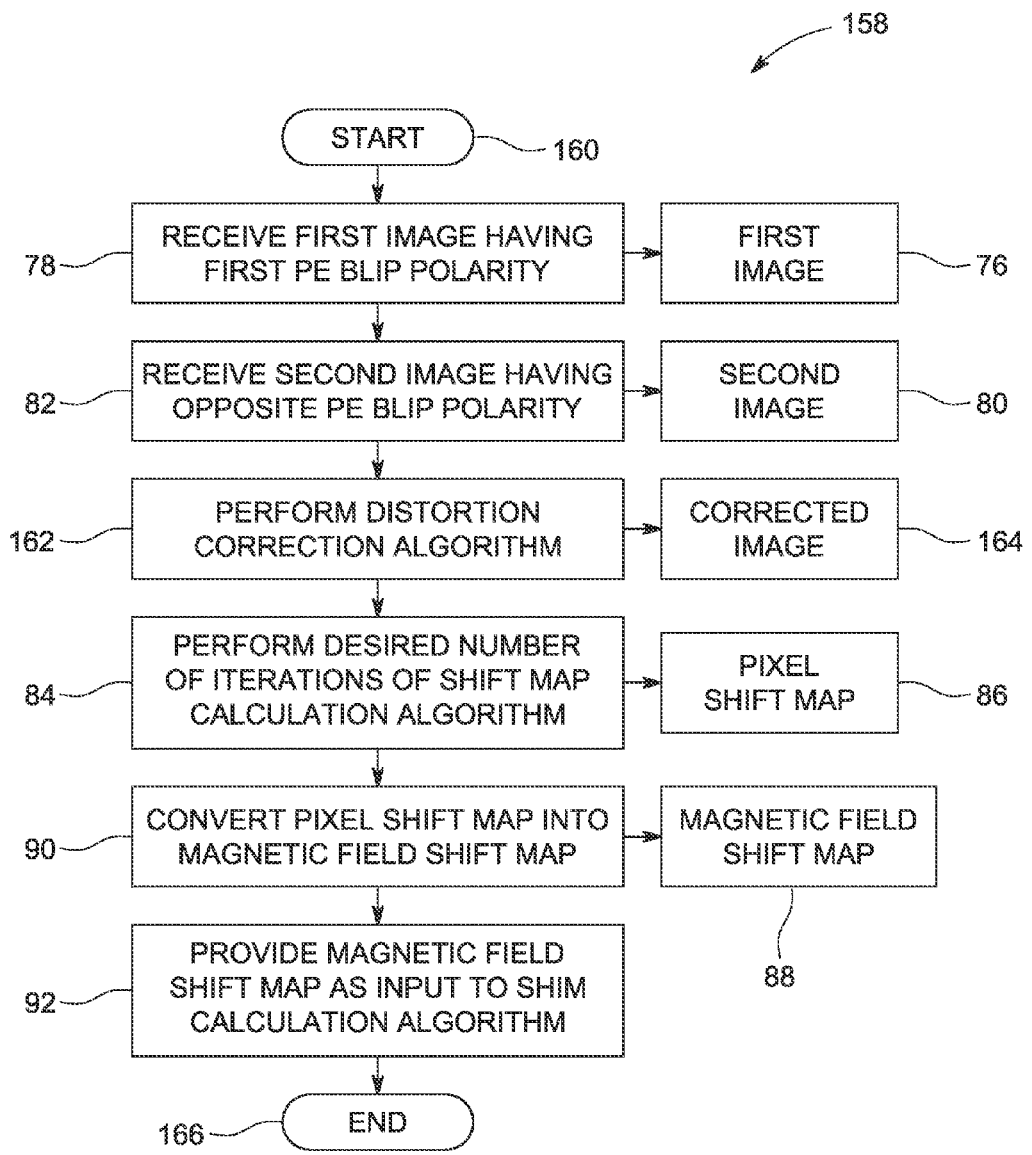
FIG. 6 is a process flow diagram illustrating an embodiment of a method for producing a magnetic field shift map based on corrected MR images in accordance with an aspect of the present disclosure.

FIG. 6 is a process flow diagram illustrating an embodiment of a method 158 for producing a magnetic field shift map based on corrected MR images in accordance with an embodiment. As illustrated, once the method 158 is initiated (block 160), data corresponding to the first image 76 having the first PE blip polarity is received (block 78), and data corresponding to a second image 80 having a PE blip polarity that is opposite that of the first image is received (block 82). As before, in certain instances, the first image 76 may be a forward spatial encoding polarity image, and the second image 80 may be a reverse spatial encoding polarity image (i.e., the phase-encoding gradient is reversed with respect to the gradient used to acquire the first image).

In this embodiment, however, the method 158 proceeds by performing a distortion correction algorithm (block 162) to derive a corrected image 164. The foregoing step may be included in instances in which the acquired images exceed a predetermined acceptable distortion threshold. In one embodiment, the corrected image 164 may be obtained by applying the equations described in an article entitled, "A Technique for Accurate Magnetic Resonance Imaging in the Presence of Field Inhomogeneities," (IEEE Trans. Med. Imaging, Vol. 11, p. 319-329 (1992), the contents of which are hereby incorporated by reference) by Hsuan Chang and J. Michael Fitzpatrick. For example, as disclosed by Chang and Fitzpatrick, a corrected image, $I_0$, is given by:

$$I_0(x) = \frac{2I_1(x_1)I_2(x_2)}{I_1(x_1) + I_2(x_2)}, \quad (2)$$

wherein $I_1$ is the first image acquired with the first gradient, and $I_2$ is the second image acquired with the second gradient.

Once the corrected image 164 is determined in this manner, a desired number of iterations of the shift map calculation algorithm (block 84) is performed to derive a pixel shift map 86, for example, as described in detail above with respect to FIG. 2. Subsequently, the method 158 proceeds as described above by converting the pixel shift map 86 into the magnetic field shift map 88 (block 90). Once the magnetic field shift map 88 is determined, the method 158 proceeds by providing the magnetic field shift map as an input to a shim calculation algorithm (block 92), and the method 158 is concluded (block 166).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of shimming a magnetic resonance (MR) magnet of an MR imaging system, comprising:
   receiving a forward spatial encoding polarity magnetic resonance coil image and a reverse spatial encoding polarity MR coil image, the reverse spatial encoding polarity MR coil image being generated from data obtained with a magnetic field gradient that is reversed with respect to the magnetic field gradient with which the forward spatial encoding polarity MR coil image is acquired;
   performing an iterative shift map calculation algorithm in order to determine a pixel shift map based in part on the forward spatial encoding polarity MR coil image, the reverse spatial encoding polarity MR image, and a cost function quantifying pixel displacements between the forward and reverse spatial encoding polarity MR coil images in order to stabilize at least linear first and second order spatial features of the pixel shift map;
   converting the pixel shift map into a magnetic field shift map by determining a magnetic field value corresponding to each pixel in the pixel shift map; and
   providing the magnetic field shift map as an input to a shim calculation process in order to determine a level of at least one shim current passed through at least one shim coil in order to shim the MR magnet.

2. The method of claim 1, comprising iteratively performing the iterative shift map calculation algorithm until one or more low order features of the pixel shift map substantially stabilize.

3. The method of claim 1, wherein determining the magnetic field value corresponding to each pixel in the pixel shift map pixel is based on echo spacing utilized in echo planar imaging scans performed in order to generate the data corresponding to the forward spatial encoding polarity MR coil image and the reverse spatial encoding polarity MR coil image.

4. The method of claim 1, wherein the shim calculation process comprises a linear shim calculation.

5. The method of claim 1, wherein the shim calculation process comprises a high order shim calculation.

6. The method of claim 1, comprising performing a distortion correction algorithm on the forward and reverse spatial encoding polarity MR coil images before performing the iterative shift map calculation algorithm.

7. The method of claim 1, wherein the shim calculation process comprises computing at least one shim coefficient.

8. The method of claim 7, comprising performing the iterative shift map calculation algorithm until the at least one shim coefficient substantially stabilizes.

9. A magnetic resonance (MR) imaging system, comprising:
   an imager comprising an MR magnet and being configured to acquire a forward spatial encoding polarity MR coil image and a reverse spatial encoding polarity MR coil image, the reverse spatial encoding polarity MR coil image being generated from data obtained with a magnetic field gradient that is reversed with respect to the magnetic field gradient with which the forward spatial encoding polarity MR coil image is acquired; and
   control circuitry configured to receive the forward spatial encoding polarity MR image and the reverse spatial encoding polarity MR image from the imager and to:
   perform an iterative shift map calculation algorithm in order to determine a pixel shift map based in part on the forward spatial encoding polarity MR coil image, the reverse spatial encoding polarity MR coil image, and a cost function quantifying pixel displacements between the forward and the reverse spatial encoding polarity MR coil images in order to stabilize at least linear first and second order spatial features of the pixel shift map;
   convert the pixel shift map into a magnetic field shift map by determining a magnetic field value corresponding to each pixel in the pixel shift map; and
   perform a shim calculation process utilizing the magnetic field shift map as an input in order to determine a level of a shim current passed through a shim coil of the imager in order to shim the MR magnet.

10. The system of claim 9, wherein the imager comprises a shim coil current supplier configured to supply the shim coil with the shim current.

11. The MR imaging system of claim 9, wherein the control circuitry is further configured to perform a distortion correction algorithm on the forward and reverse spatial encoding polarity MR coil images before determining the pixel shift map.

12. The MR imaging system of claim 9, wherein the control circuitry is configured to perform the iterative shift map calculation algorithm until one or more low order features of the pixel shift map substantially stabilize.

13. The MR imaging system of claim 9, wherein the forward spatial encoding polarity MR coil image and the reverse spatial encoding polarity MR coil image are acquired via an echo planar imaging process.

14. The MR imaging system of claim 13, wherein the control circuitry is configured to determine the magnetic field value corresponding to each pixel in the pixel shift map pixel based on echo spacing utilized in the echo planar imaging process performed to generate the data corresponding to the forward spatial encoding polarity MR coil image and the reverse spatial encoding polarity MR coil image.

15. One or more tangible, non-transitory machine-readable media comprising instructions that when executed by a processor, cause the processor to:
perform an iterative shift map calculation algorithm in order to determine a pixel shift map based in part on a forward spatial encoding polarity magnetic resonance (MR) coil image, a reverse spatial encoding polarity MR coil image, and a cost function quantifying pixel displacements between the forward and reverse spatial encoding polarity MR coil images in order to stabilize at least linear first and second order spatial features of the pixel shift map, wherein the reverse spatial encoding polarity MR coil image is generated from data obtained with a magnetic field gradient that is reversed with respect to the magnetic field gradient with which the forward spatial encoding polarity MR coil image is acquired;
convert the pixel shift map into a magnetic field shift map by determining a magnetic field value corresponding to each pixel in the pixel shift map; and
perform a shim calculation process utilizing the magnetic field shift map as an input in order to determine a level of a shim current passed through a shim coil of an MR imager in order to shim an MR magnet of the MR imager.

16. The one or more tangible, non-transitory machine-readable media of claim 15, wherein the shim calculation process comprises a linear shim calculation.

17. The one or more tangible, non-transitory machine-readable media of claim 15, wherein the shim calculation process comprises a high order shim calculation.

18. The one or more tangible, non-transitory machine-readable media of claim 15, further comprising instructions that when executed by a processor, cause the processor to perform a distortion correction algorithm on the forward and reverse spatial encoding polarity MR coil images before determining the pixel shift map.

* * * * *